US007084053B2

(12) United States Patent
Golzarian et al.

(10) Patent No.: US 7,084,053 B2
(45) Date of Patent: Aug. 1, 2006

(54) UNIDIRECTIONALLY CONDUCTIVE MATERIALS FOR INTERCONNECTION

(75) Inventors: Reza M. Golzarian, Beaverton, OR (US); Robert P. Meagley, Hillsboro, OR (US); Seiichi Morimoto, Beaverton, OR (US); Mansour Moinpour, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/676,294

(22) Filed: Sep. 30, 2003

(65) Prior Publication Data

US 2005/0070096 A1   Mar. 31, 2005

(51) Int. Cl.
*H01L 21/44* (2006.01)
(52) U.S. Cl. .............. 438/610; 438/597; 438/598; 438/615; 438/643; 438/645; 438/652; 438/653; 438/659; 438/678; 438/679; 438/680; 438/626; 438/627; 438/629
(58) Field of Classification Search ........ 438/597–598, 438/610, 615, 643, 645, 652–653, 659, 678–680, 438/626, 627, 629
See application file for complete search history.

(56) References Cited

U.S. PATENT DOCUMENTS

| | | | | |
|---|---|---|---|---|
| 4,233,671 | A | * 11/1980 | Gerzberg et al. | 365/105 |
| 6,121,688 | A | * 9/2000 | Akagawa | 257/778 |
| 2004/0057191 | A1 | * 3/2004 | Timonov et al. | 361/302 |

OTHER PUBLICATIONS

Kawagishi et al.,, "Novel Electrical, Optical and Rheological Properties of Conducting Polymer in Liquids and Solutions Infiltrated in Opals and Inverse Opals", 13th International Conference on Dielectric Liquids, Nara, Japan, Jul. 20-25, 1999.*

Ruschau et al., "Percolation Constraints in the Use of Conductor-Filled Polymers for Interconnects", 1992 IEEE, pp 481-486.*

Yi-Li et al., "Electrical Property of Anisotropically Conductive Adhesive Joints Modified by Self-Assembled Monolayer (SAM)", 54th Electronic Components and Technology Conference, vol. 2, Las Vegas, NV, USA, Jun. 1-4, 2004.*

* cited by examiner

*Primary Examiner*—George Fourson
*Assistant Examiner*—Thanh V. Pham
(74) *Attorney, Agent, or Firm*—Blakely, Sokoloff, Taylor & Zafman LLP (57) ABSTRACT

A method of forming and a device including an interconnect structure having a unidirectional electrical conductive material is described. The unidirectional conductive material may overlie interconnect materials, and/or may surround interconnect materials, such as by lining the walls and base of a trench and via. The unidirectional conductive material may be configured to conduct electricity in a direction corresponding to a projection to or from a contact point and conductive material overlying the unidirectional conductive material, but have no substantial electrical conductivity in other directions. Moreover, the unidirectional conductive material may be electrically conductive in a direction normal to a surface over which it is formed or in directions along or across a plane, but have no substantial electrical conductivity in other directions. Finally, the unidirectional conductive material may have properties tending to reduce metal diffusion, reduce electron migration, provide adhesion or bonding, and/or act as an etch stop.

8 Claims, 4 Drawing Sheets

UNIDIRECTIONALLY CONDUCTIVE MATERIALS FOR INTERCONNECTION

FIELD

Circuit devices and the manufacture and structure of circuit devices.

BACKGROUND

Electronic access to and operation of circuit devices (e.g., transistors, resistors, capacitors, and inductors) on a substrate, such as circuit devices on a semiconductor (e.g., silicon) substrate is generally provided by contacts to the devices, and interconnects to the contacts. For example, modern integrated circuits (ICs), including metal oxide semiconductor (MOS) and other transistor devices use conductive contacts and interconnections connected to the individual devices to integrate devices and send and receive signals external to a chip in which the IC is fabricated. In addition, these circuit devices use dielectric layers to isolate the individual devices on a chip from the contacts and interconnects. Therefore, during manufacture or forming of circuit devices, it is generally desired to ensure that conductive materials that make up contacts and interconnects are confined within dielectric layers, and do not diffuse into dielectric layers or electrically conduct to unwanted contacts and interconnects (e.g., such as those within the same metal layer).

BRIEF DESCRIPTION OF THE DRAWINGS

Various features, aspects, and advantages will become more thoroughly apparent from the following detailed description, appended claims, and accompanying drawings in which:

DETAILED DESCRIPTION

Integrated circuits typically use conductive interconnections to connect the individual devices on a chip or to send and/or receive signals external to the chip. Currently popular types of interconnections include aluminum alloy interconnections (lines) and copper interconnections (lines) coupled to individual devices, including other interconnections (lines) by interconnections, for example, through vias.

A typical method of forming an interconnection, particularly a copper interconnection involves forming a via in a dielectric material layer to an underlying circuit device, such as a transistor or an interconnection, then forming an interconnect on the dielectric layer or commonly in a trench in the dielectric layer. The via and possible trench are then lined with a barrier layer of a refractory material, such as titanium nitride (TiN), Tungsten Nitride (WN), Titanium Tungsten (TiW), tantalum (Ta), or tantalum nitride (TaN). The barrier layer serves, in one aspect, to inhibit the diffusion of the interconnection material that will subsequently be introduced in the via and trench into the adjacent dielectric. The barrier material on the sidewalls of a via and trench also provides adhesion to the adjacent dielectric material.

In addition to the barrier material in a via and possible trench, a suitable seed material may be deposited on the wall or walls of the via and trench on the barrier material. Suitable seed materials for the deposition of copper interconnection material include copper (Cu), nickel (Ni), and cobalt (Co).

Next, interconnection material, such as copper, is introduced by electroplating or physical deposition in a sufficient amount to fill the via and possible trench and complete the interconnect structure. Once introduced, the interconnection structure may be planarized and a dielectric material layer (including an interlayer dielectric material) introduced over the interconnection structure to suitably isolate the structure. Copper has become a popular choice of interconnection material for various reasons, including its low resistivity compared with the resistivity of aluminum or aluminum alloys.

Figure 1:
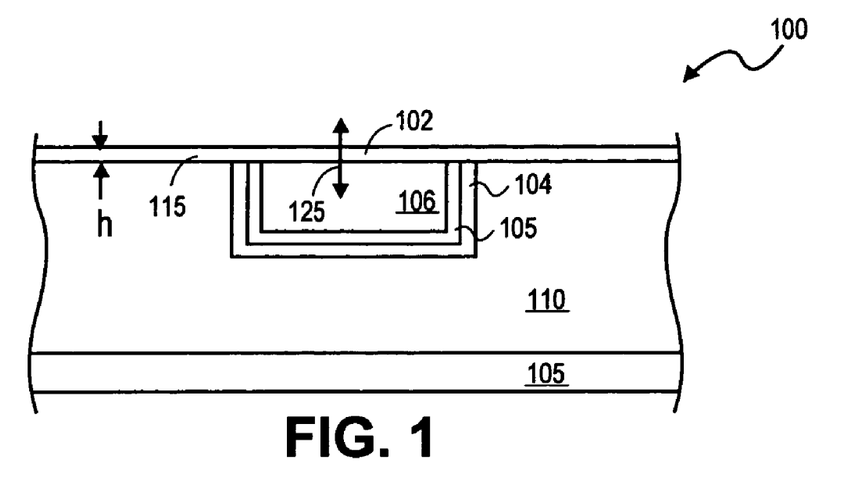
FIG. 1 is a schematic cross-section view of a portion of a semiconductor substrate having an interconnect structure and a unidirectional electrical conductive material formed over the interconnect structure.

In one embodiment, an interconnect structure including a unidirectional electrical conductive material is described. For example, FIG. 1 is a schematic cross-section view of a portion of a semiconductor substrate having an interconnect structure and a unidirectional electrical conductive material formed over the interconnect structure. FIG. 1 shows a typical integrated circuit structure, such as a portion of a microprocessor on a silicon chip. A typical integrated circuit such as a microprocessor chip may have, for example, four or five interconnection layers or levels separated from one another by dielectric material. Structure 100 includes an interconnection line over substrate 105. Substrate 105 may be the base substrate (e.g., silicon substrate) having circuit devices, including transistors, thereon as well as one or more levels of interconnection to devices. FIG. 1 shows interconnect 106 that may be part of or coupled to a circuit device formed on or in a base substrate or an interconnection line formed above the base substrate to devices on the base substrate. It is appreciated that the techniques described herein may be used for various interconnections within an integrated circuit including to circuit devices and other interconnections. In this sense, interconnect 106 represents such devices or interconnections where an interconnection contact is made.

Overlying substrate 105 is dielectric material 110. Dielectric material 110 is, for example, silicon dioxide ($SiO_2$) formed by a tetraethyl orthosilicate (TEOS) or similar source in, for example, a chemical vapor deposition (CVD) process. Dielectric material 110 may also be a material having a dielectric constant less than the dielectric constant of $SiO_2$ (e.g., a "low k" material), including polymers as known in the art.

FIG. 1 also shows barrier material 104 (e.g., such as unidirectional electronic conductive material 115 or 440, as described below), conductive material 105 (e.g., such as a seed layer), and interconnect 106 having exposed interconnect surface 102. Materials 104 and 105, and interconnect 106 may be part of a circuit device or an interconnection line to a circuit device. For example, vias may be formed in dielectric material 110 between interconnect 106 and circuit devices in substrate 105 below or under interconnect 106.

In addition, FIG. 1 shows conductive material 115 on a surface of dielectric material 110 and exposed surface 102 of interconnect 106. For example, according to embodiments, conductive material 115 may include a unidirectional electrical conductivity configured to conduct electricity in a direction normal to a surface of interconnect 106. Thus, conductive material 115 may be configured to conduct electricity in direction 125 normal or perpendicular to exposed surface 102 of interconnect 106. Unidirectional electronic conductive material 115 is chosen, in one embodiment, to be effective to inhibit interconnect material diffusion, such as copper diffusion into dielectric material 110. Conductive material 115 may also be chosen for its bonding or adhering properties to dielectric material 110.

According to embodiments, suitable materials for conductive material 115 comprise organic material, organic material doped with a metallic material, organo-metallic material, organo-metallic compounds, polymeric material, and/or doped polymeric material. Thus, to form conductive material 115, various appropriate metals or metallic material may be included in the above identified materials as a component of a compound, as a "backbone" of a polymer (e.g., such as a backbone for providing a conduction continuity from one segment or chain of the polymer structure to another segment or chain of the polymer structure, or for being embedded within a segment or chain of the polymer structure), as a conductive component of a polymer, and/or as a doping agent to dope material. For example, appropriate metals or metallic material for inclusion in or doping of material to form conductive material 115 include barium, vanadium, chrome, copper, niobium, lithium, ruthenium, palladium, silver, tantalum, tungsten, platinum, gold, aluminum, lanthanum, and titanium. Additionally, according to embodiments, appropriate metals or metallic material for inclusion in or doping of material to form conductive material 115 may have various appropriate crystalline atomic structures including body centered cubed (BCC), face centered cubed (FCC), and/or hexagonal closed packed (HCP) structure arrangement or configurations. Hence, one or more of the above listed metals or metallic materials may be selected for inclusion in or doping of an organic or polymeric material to form conductive material 115 so that conductive material 115 has a unidirectional or multidirectional conductive property as described herein.

Also, in embodiments a non-metal can be used to switch the conductivity of the polymer from one conduction band to a second more conductive conduction band. For instance, nitrogen, iodine, sulfur, fluorine, chlorine, and/or phosphorous may be selected for inclusion in or doping of a polymeric material to form conductive material 115, to raise the ferme level of polymeric material. Thus, the ferme level may be raised sufficiently to conduct electrons along the path of the carbon chains of the polymeric material so that conductive material 115 has a unidirectional or multidirectional conductive property as described herein.

Moreover, conductive material 115 may include appropriate doped polymer material, and/or polymeric material including polyanaline, polypyrole, polyphenylene, poly(p-phenylenevinylene), polyacetylene, polypyrrole, carbon nanotubes as well as functionalized, or substituted, copolymerized and or blended derivatives of the aforementioned polymers. In addition, conductive materials may comprise films formed by self-assembly of molecular species that support functional groups that facilitate conduction. Such molecular species may comprise alkyl chains and/or substituted alkyl chains functionalized by conjugated moieties at their ends. For example, conductive material 115 may comprise polymers having approximately 0.5–50 cubic nm hydrodynamic volumes, and/or 1000–200000 Daltons molecular weight. The polymeric material and/or doped polymeric materials mentioned above may comprise oriented films and/or may be intrinsically conductive.

Conductive material 115 may be introduced or formed by conventional techniques, such as electroplating, electrochemical polymerization, spin casting, chemical vapor deposition (CVD), sputter deposition, molecular beam deposition, and gel separation in an electronic field. In one embodiment, unidirectional electronic conductive material 115 is deposited to a thickness in the range of between 5 angstroms (Å) and 3000 Å, such as shown by height "h" in FIG. 1, depending on the desired characteristics of the unidirectional electronic conductive material selected. In one embodiment, unidirectional electronic conductive material 115 is annealed in a magnetic field to orient the directionality of conductivity of the film. In one embodiment, unidirectional electronic conductive material 115 is mechanically stretched or stressed to orient the directionality of conductivity of the film prior to application.

After formation, conductive material 115 may be planarized such as by, for example, a chemical-mechanical polish (CMP) with a polishing slurry or via Spin Etch planarization methodology or electro polishing. Moreover, in embodiments, conductive material 115 once formed may be doped, or implanted with ions for impurities to modify (e.g., improve) bonding or adhering characteristics of conductive material 115 (e.g., to bond or adhere to interconnects, dielectrics, conductive layers, seed layers, and other materials as desired). Moreover, conductive material 115 can be doped or implanted with ions to modulate conductivity such as by adding an impurity to conductive material 115 to increase unidirectional electronic conductivity in a desired direction, such as direction 125 illustrated in FIG. 1. Dopants may comprise electron donating (oxidizing) or electron deficient (reducing) moities or additives, including quinone, semiquinone, iodine, etc. and acid (mineral or organic acids such as nonflurobutanesulfonic, nitric, etc.) in the case of polyaniline and as functionalized, substituted, copolymerized and or blended derivatives.

Figure 2:
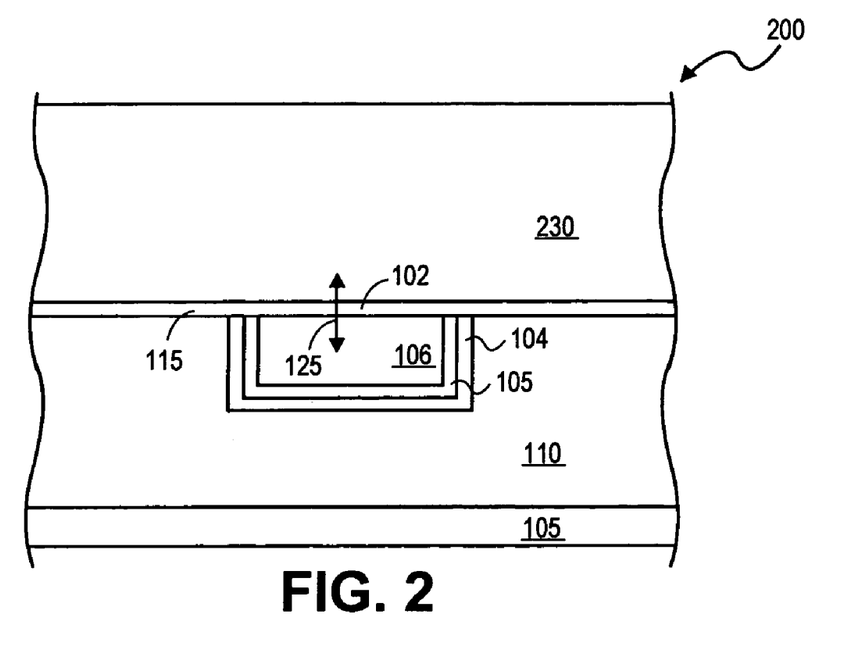
FIG. 2 shows the semiconductor substrate of FIG. 1 after forming a dielectric layer over the interconnect structure.

FIG. 2 shows the structure of FIG. 1 after forming a dielectric layer on the structure. FIG. 2 shows dielectric material 230 deposited on unidirectional electronic conductive material 115. Dielectric material 230 may be a material similar to those described above with respect to material 110, and may be formed using methods similar to those described above with respect to material 110. FIG. 2 also shows, conductive material 115 configured to be electrically conductive in direction 125 corresponding to a projection to or from surface 102 and dielectric 230.

Figure 3:
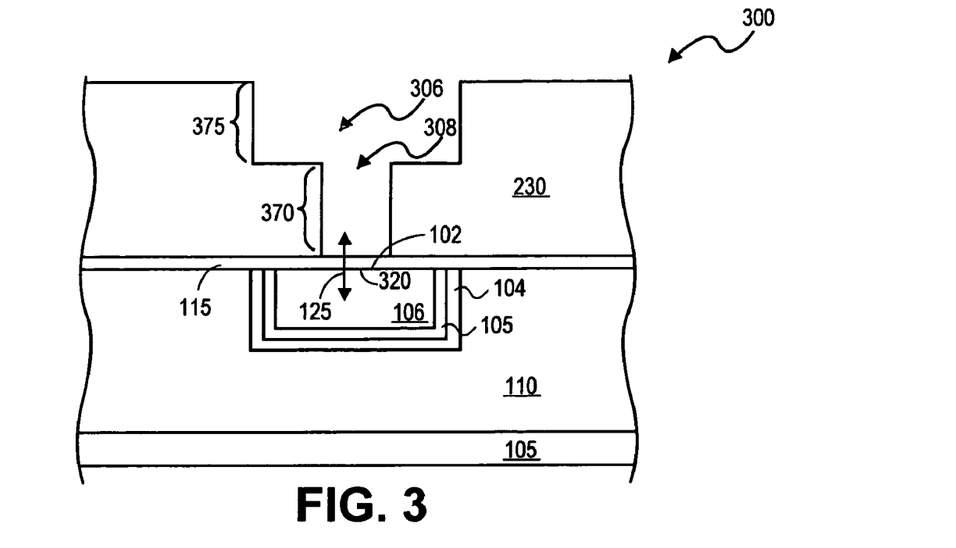
FIG. 3 shows the semiconductor substrate of FIG. 1 after forming an opening in the dielectric layer over the interconnect.

FIG. 3 shows the structure of FIG. 1 after forming an opening in the dielectric layer on the interconnect. FIG. 3 shows an opening through dielectric material 230 overlying interconnect 106. For instance, FIG. 3 shows via 308 through dielectric material 230 to expose conductive material 115. FIG. 3 also shows trench 306 formed in a portion of dielectric material 230 over via 308. A trench and via may be formed according to known techniques by, for example, initially using a mask, such as a photoresist mask to define an area (e.g., a cross-sectional area) for a via opening and etching the via with a suitable chemistry, such as, for example, a $CH_3/CF_4$ or $C_4F_8$ etch chemistry for $SiO_2$. The mask may then be removed (such as by an oxygen plasma to remove photoresist) and a second mask patterned to define a greater area (e.g., a greater cross-sectional area) for a trench opening. A subsequent mask and etch is introduced to form a trench and the second mask is removed leaving the substrate shown in FIG. 3. Thus, trench 306 having a trench height 375 and via 308 having via height 370 may be formed in dielectric material 230 over contact point 320 of interconnect 106. Contact point 320 may correspond to a point on the surface of surface 102 of interconnect 106.

In one embodiment, conductive material 115 may be selected to be a layer of material comprising a property tending to reduce metal diffusion between interconnect 106, material 104, or material 105, and overlying dielectric material 230. Furthermore, conductive material 115 may be selected to include a layer of material comprising a property tending to reduce electron migration between interconnect 106, material 104, or material 105, and overlying dielectric material 230. Furthermore, conductive material 115 may be selected to include a layer of material comprising a property tending to act as an etch stop layer, such as to provide an etch stop for a process used to etch via 308.

In addition, it is to be appreciated that surface 102 may not be planar (e.g., such as is shown in the figures) but may include irregularities such as peaks, valleys, and uneven surfaces. Thus, in some embodiments, conductive material 115 may include a unidirectional electrical conductivity configured to be electrically conductive in a direction corresponding to a projection to or from contact point 320 and via 308.

Moreover, in certain embodiments, forming of via 308 may include forming a via through conductive material 115 (e.g., an embodiment not shown in the figures). Thus, via 308 may be etched through conductive material 115 and to interconnect 106 at surface 102. For instance, embodiments also include where via 308 exposes contact point 320.

Figure 4:
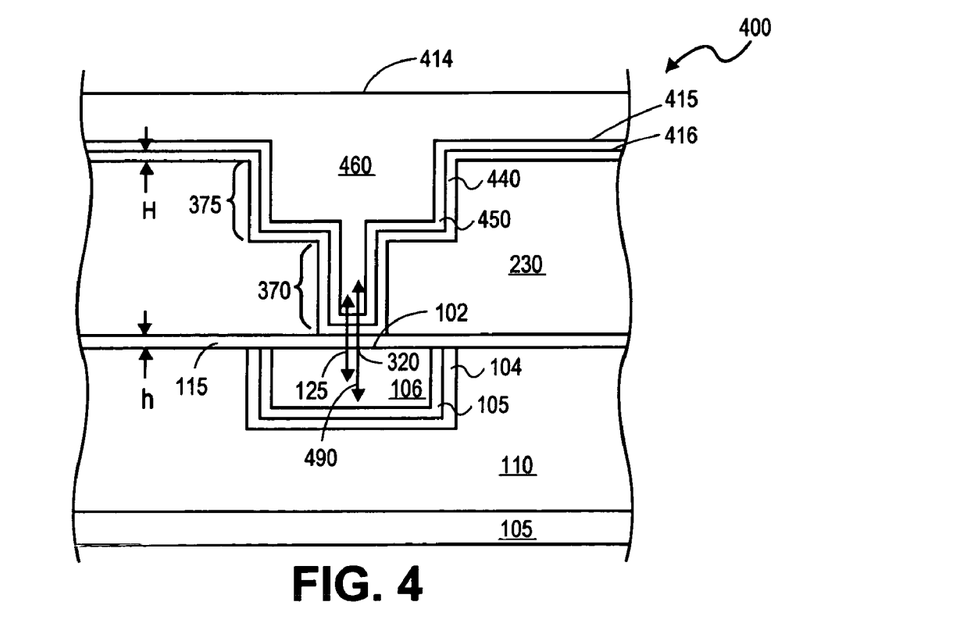
FIG. 4 shows the semiconductor substrate of FIG. 1 after forming unidirectional electrical conductive material and an interconnect structure in the opening in the dielectric layer over the interconnect below.
Figure 5:
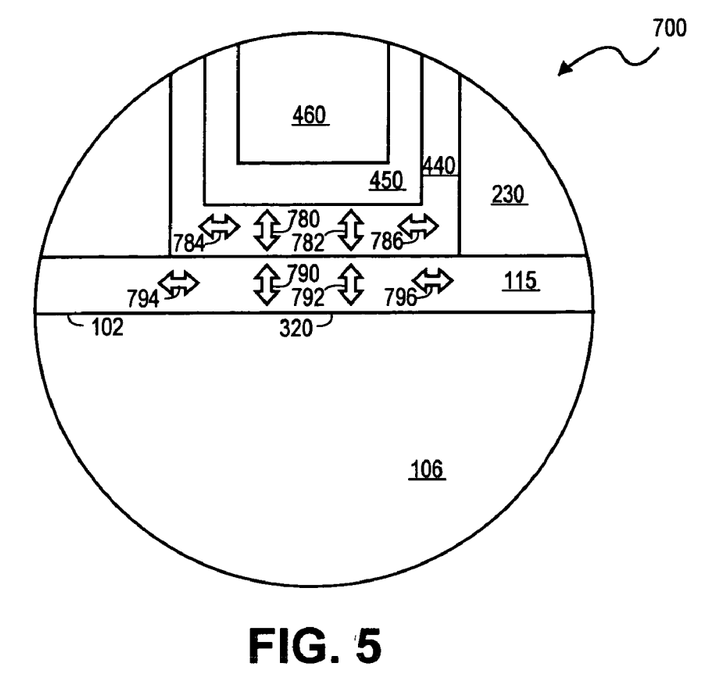
FIG. 5 is a magnified portion of the semiconductor substrate of FIG. 4, showing unidirectional conductivity.
Figure 6:
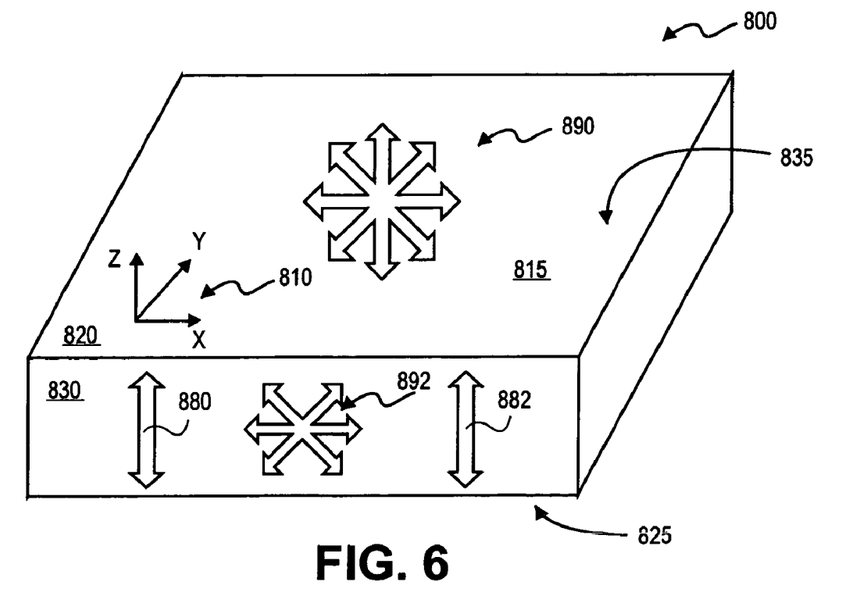
FIG. 6 is a schematic cross-section view of a portion of a unidirectional electrical conductive material.

FIG. 4 shows the structure of FIG. 1 after forming unidirectional electrically conductive material and an interconnect structure in the opening in the dielectric layer over the interconnect below (as viewed). FIG. 4 shows unidirectional electronic conductive material 440 in trench opening 306 and via opening 308. For example, in embodiments, conductive material 440 may be formed to conductive material 115 on contact point 320 (e.g., as shown in FIGS. 4–6) or may be formed to contact point 320 on surface 102 of interconnect 106.

FIG. 4 also shows the structure having unidirectional electrically conductive material 440 formed along the sidewalls of the via and trench opening. Suitable materials for unidirectional electrically conductive material 440 include those described above and those having characteristics as described above with respect to conductive material 115. Moreover, conductive material 440 may be introduced by techniques, such as described above with respect to conductive material 115. Moreover, in embodiments, conductive material 440 may be doped or implanted, as is described above with respect to doping and implanting of conductive material 115. In one embodiment, unidirectional electrically conductive material 440 is deposited to a thickness of approximately 5 to 3000 Å, such as shown by height "H" in FIG. 4, depending on the desired characteristics of the unidirectional electrically conductive material selected. Moreover, height "H" may be the same as, greater than, or less in height than height "h", as shown in FIG. 1.

Unidirectional electrically conductive material 440 may be chosen, in one embodiment, to be effective to inhibit interconnect material diffusion, such as copper diffusion into dielectric material 230. Unidirectional electrically conductive material 440 may also be chosen for its adhering properties to dielectric material 230. Conductive material 440 may also be chosen to have etch stop characteristics similar to those described above with respect to conducive material 115. In one embodiment, conductive material 440 is formed in trench 306 and via 308 openings to substantially coat material at the base of via 308 (e.g., such as conductive material 115 or interconnect 106), as well as the sidewalls and base of the trench and via.

Referring to FIG. 4, overlaying conductive material 440 as a blanket including along the sidewalls and bottom of via 308 and trench 306 is conductive material 450, such as a seed material. Conductive material 450 is used, in one sense, in connection with a subsequent electroplating process to form an interconnection in via 308 and trench 306. Conductive material 450 generally provides uniform current flow during electroplating. Moreover, conductive material 450 provides enhanced adhesion of the subsequently formed interconnect material 460 to the substrate, such as to conductive material 450 and/or dielectric material 230.

In embodiments, conductive material 450 may be deposited using techniques such as sputter deposition, standard chemical deposition techniques, and/or standard physical deposition techniques for depositing a seed layer into an opening. Conductive material 450 may include copper, aluminum, tantalum, tantalum nitrite, and silicon carbide. For example, in one embodiment, conductive material 450 is, for example, a copper material introduced using chemical or physical deposition techniques. A thickness of conductive material 450 as a seed material along the sidewalls and bottom of via 308 and trench 306 of less than 3,000 Å is suitable.

As illustrated in FIG. 4, conductive material 440 may be disposed between conductive material 115 (or surface 102) and conductive material 450. As such, conductive material 440 may adhere to or be formed to bond with dielectric material 230, conductive material 450, and conductive material 115 (or surface 102 of interconnect 106). Similarly, conductive material 115 may adhere to or bond together dielectric material 110, dielectric material 230, surface 102 of interconnect 106, and conductive material 440. Likewise, conductive material 450 may be a seed layer disposed between, adhering to, and/or bonding together conductive material 440 and interconnect material 460.

FIG. 4 shows structure 400 after filling via 308 and trench 306 with interconnect material 460 of, for example, a multidirectional conductive material, such as a copper material. One introduction technique for a copper interconnect material as noted above is an electroplating process. By way of example, a typical electroplating process involves introducing a substrate (e.g., a wafer) into an aqueous solution containing metal ions, such as copper sulfate-based solution, and reducing the ions (reducing the oxidation number) to a metallic state by applying current between the substrate and an anode of an electroplating cell in the presence of the solution. Metal is deposited on to conductive material 450 of the substrate, to fill, for example, via and trench and forms an interconnection material.

In one embodiment, interconnect material 460 is copper or a copper alloy. Suitable copper alloys include copper tin (CuSn), copper-indium (CuIn), copper-cadmium (CuCd), copper-zinc (CuZn), copper-bismuth (CuBi), copper-ruthenium (CuRu), copper-rhodium (CuRh), copper-rhenium (CuRe), copper-tungsten (CuW), copper-cobalt (CuCo), copper-palladium (CuPd), copper-gold (CuAu), copper-platinum (CuPt) copper-aluminum (CuAl), and copper-silver (CuAg). Alloys are generally formed by one of two methods. Typically, copper-tin, copper-indium, copper-cadmium, copper-bismuth, copper-ruthenium, copper-rhenium, copper-rhodium, and copper-tungsten are electroplated. Alternatively, copper may be doped with catalytic metals such as silver, platinum, tin, rhodium, and ruthenium by introducing a contact displacement layer on top of planarized copper interconnection material (see next paragraph) and annealing or radiation or some form of energy to form an alloy.

According to embodiments, conductive material 440 may include a unidirectional electrically conductivity configured to be in a direction corresponding to projection 490 to or from exposed surface 102 of interconnect 106 (which may or may not be planar, as described above with respect to surface 102) and conductive material 460 overlying contact point 320 (as viewed). Moreover, conductive material 450 may be introduced into via 308 and trench 306 in a manner that leaves conductive material 440 overlying contact point 320 (as viewed).

Furthermore, according to embodiments, unidirectional electrically conductive material 440 may have no substantial electrical conductivity in directions other than corresponding to a projection to or from contact point 320 and conductive material 450. For example, FIG. 5 is a magnified portion of the structure of FIG. 4, showing unidirectional electrical conductivity. FIG. 5 shows material 440 having unidirectional conductivity configured to be in a direction corresponding to projections 780 and 782 to or form contact point 320 (or surface 102) and conductive material 450; but having no substantial electrical conductivity in directions other than corresponding to projections 780 and 782. Thus, conductive material 440 has no substantial electrical conductivity in directions corresponding to projections 784 and 786, as shown in FIG. 5. Moreover, in certain embodiments, conductive material 440 may have no substantial electrical conductivity in directions other than in a direction corresponding to a projection to or from conductive material 115 and conductive material 440. Also, in embodiments, unidirectional electrically conductive material 115 may have no substantial electrical conductivity in directions other than normal to surface 102 of interconnect 106.

Furthermore, according to embodiments, unidirectional electrically conductive material 115 may have no substantial electrical conductivity in directions other than corresponding to a projection to or from contact point 320 and conductive material 440 or conductive material 450. Likewise, in embodiments, unidirectional electrically conductive material 115 may have no substantial electrical conductivity in directions other than normal or perpendicular to surface 102 of interconnect 106. For example, FIG. 5 shows conductive material 115 having unidirectional conductivity configured to be in a direction corresponding to projections 790 and 792 to or form contact point 320 (or surface 102) and conductive material 440; but having no substantial electrical conductivity in directions other than corresponding to projections 790 and 792. Thus, conductive material 115 has no substantial electrical conductivity in directions corresponding to projections 794 and 796, as shown in FIG. 5. Moreover, as mentioned above, in embodiments, conductive material 115 may not exist between conductive material 440 and surface 102 of interconnect 106.

Thus, for instance, in embodiments, polymers either doped or undoped (e.g., such as forming unidirectional electrically conductive materials 115, 440, and/or 680, as described herein) which are designed to electrically conduct in one direction (e.g., such as the "Z" direction, as described below with respect to FIG. 6) can be used to connect electrically between two metal layers (e.g., such as interconnects 460 and 106) and yet prohibit electrical conduction with other interconnects within the same metal layer, such as the metal layer associated with a plane formed at surface 102 (e.g., such as by allowing conduction, as shown by projections 780, 782, 790, and 792 but not in directions corresponding to projections 784, 786, 794, and 796). For example, FIG. 6 is a schematic cross-section view of a portion of a unidirectional electrically conductive material. FIG. 6 shows unidirectional electrically conductive material 815, Cartesian axes 810, X-Y surface 820, and X-Z surface 830. Thus, material 815 may have unidirectional electrical conductivity configured to be in a direction corresponding to projections 880 and 882, such as projecting to or from a contact point or surface of material below or under material 815 (e.g., such as shown at surface 825 in FIG. 8) and a material or contact point above or overlying material 815 (e.g., as shown at surface 835 in FIG. 8). Moreover, unidirectional conductivity may be configured to be in a direction corresponding to projections 880 and 882 where those projections are normal or perpendicular to a contact point or surface of material on which material 815 is formed (e.g., such as normal or perpendicular to a surface which surface 825 is formed on). However, in embodiments, material 815 has no substantial electric conductivity in directions other than those corresponding to projections 880 and 882, as described above. Thus, material 815 may have no substantial electrical conductivity in directions shown by X-Y plane oriented surface directions 890 or X-Z plane oriented surface directions 892.

Likewise, in accordance with embodiments, material 815 may have electrical conductivity to conduct in directions defined by one or more planes, yet to have no substantial conduction in directions defined by one or more other different planes. For example, material 815 may conduct in directions along or across an X-Y plane as defined by Cartesian axes 810, yet have no substantial conduction with respect to directions along or across a Z-Y or Z-X plane defined by Cartesian axes 810. More particularly, material 815 may be electrically conductive across X-Y planes in any of the X-Y plane oriented surface directions 890, but have no substantial electrical conduction in directions other than with respect to surface directions 890 across those X-Y planes.

Moreover, according to embodiments, material 815 may be the material used to form conductive materials 115, 440, and/or 680 as described herein. Furthermore, in embodiments, a polymer based metal barrier (e.g., such as described above with respect to conductive materials 115 and 440), such as material 815 can also be used as a cap/separator layer for low-K material integration. For example, the polymer based material can serve as a barrier layer for metal diffusion into dielectric layers and as an adhesion layer for copper film. Moreover, the polymer layer may or may not be doped, as described with respect to conductive material 115 above.

Figure 7:
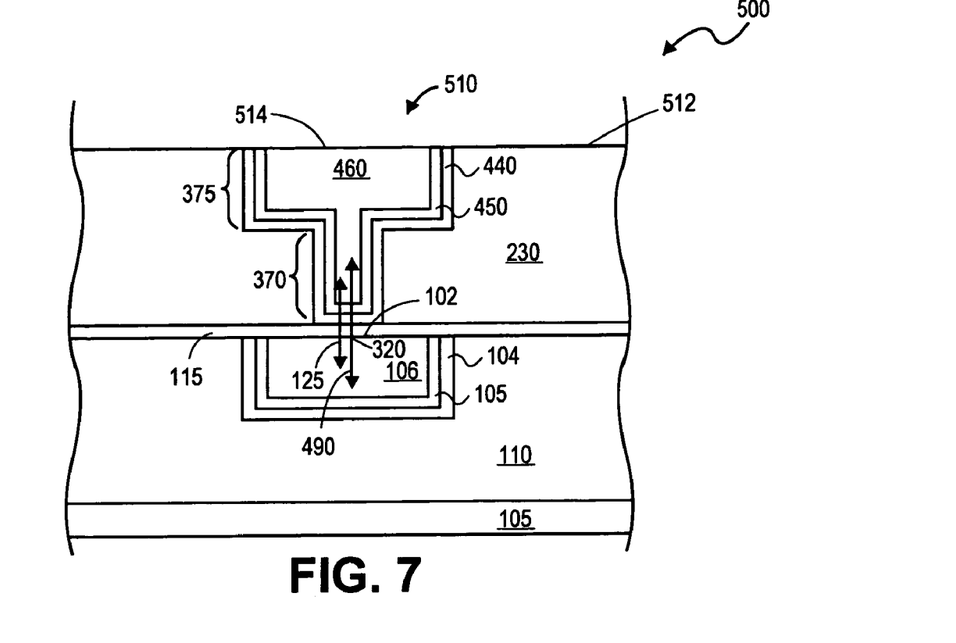
FIG. 7 shows the semiconductor substrate of FIG. 1, after removal of portions of interconnect material and unidirectional electrical conductive material from over the dielectric layer.

Referring again to FIG. 4, exposed surface 414 of interconnect material 460 may be treated, as described above with respect to treatment of conductive material 115. For example, exposed surface 414 of interconnect material 460, as shown in FIG. 4, may be confined to trench height 375 by polishing exposed surface 414. Thus, interconnect material 460, conductive material 450, and conductive material 440 overlying or present on the upper surface of dielectric material 230 (as viewed) may be removed. For instance, FIG. 7 shows the structure of FIG. 1, after removal of portions of interconnect material and unidirectional electrical conductive material from on the dielectric material 230. FIG. 7 shows structure 500 having interconnect material 460 (interconnect); conductive material 450 and conductive material 440 introduced into via 308 and trench 306 with the surface of dielectric material 230 and interconnect material 460 planarized.

Figure 8:
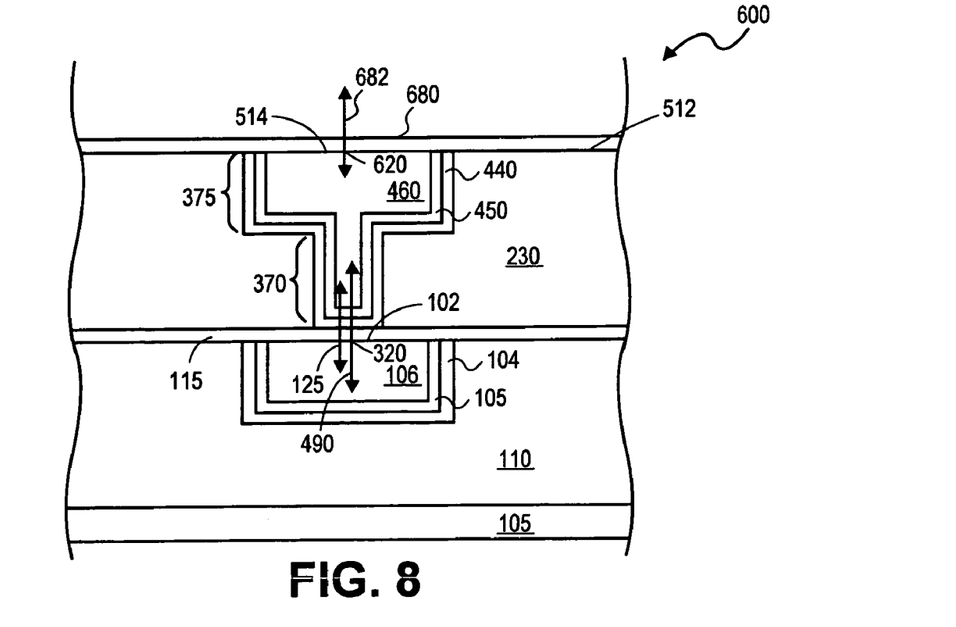
FIG. 8 shows the semiconductor substrate of FIG. 1 after forming a unidirectional electrical conductive layer on the dielectric.

FIG. 8 shows the semiconductor substrate of FIG. 1 after forming a unidirectional electrically conductive layer on dielectric material 230. More specifically, conductive material 680 may be formed on interconnect material 460 and dielectric material 230 using methods similar to and to thicknesses similar to those described above for formation of conductive material 115 on surface 102 of interconnect 106 and on dielectric material 110. Moreover, conductive material 680 may include materials, characteristics, and doping, such as those described above with respect to conductive material 115. Specifically, for example, conductive material 680 may have a unidirectional electrical conductivity configured to be in a direction corresponding to projection 682 to or from contact point 620 of conductive material 460 and a material disposed on conductive material 680, as shown in FIG. 8. In addition, according to embodiments, conductive material 680 may have unidirectional electrical conductivity configured to be in a direction normal or perpendicular to surface 514. Thus, conductive material 680 may be a material similar to and have characteristics similar to that described above for materials 115, 440, and 815. Specifically, conductive material 680 may have no substantial electrical conductivity in directions other than normal or perpendicular to surface 514. In other embodiments, conductive material 680 may have no substantial electrical conductivity in directions other than in a direction corresponding to a projection to or from contact point 620 and material formed above conductive material 680, as shown in FIG. 8.

Finally, in accordance with embodiments, conductive material 680 may inhibit metal diffusion, reduce electron migration, act as an etch stop, and have adhesive or bonding characteristics similar to that described above with respect to conductive materials 115 and conductive material 440. Specifically, for instance, conductive material 680 may bond or adhere interconnect material 460 and dielectric material 230, as well as to materials formed above material 680.

Specific embodiments have been presented. For example, a unidirectional electrically conductive material is described that may be used as one or more of (1) to overlie (as described with reference to figures) an interconnect structure, and (2) line a via and/or trench of an interconnect structure. It will, however, be evident that various modifications and changes may be made to the embodiments without departing from the broader spirit and scope as set forth in the claims. The specification and drawings are, accordingly, to be regarded in an illustrative rather than a restrictive sense.

What is claimed:

1. A method comprising:
   forming a first conductive material in an opening through a dielectric to a contact point; and
   forming a second conductive material on the first conductive material,
   wherein the first conductive material comprises a unidirectional electrical conductivity and the unidirectional conductivity is configured to be in a direction corresponding to a projection to or from the contact point and the second conductive material, and wherein forming the second conductive material comprises introducing a seed material into the via in a manner that leaves the first conductive material overlying the contact point.

2. A method comprising:
   forming a first conductive material in an opening through a dielectric to a contact point; and
   forming a second conductive material on the first conductive material;
   forming an interconnect structure in the opening on the second conductive material;
   prior to forming a third conductive material, modifying the exposed surface of the interconnect structure, wherein modifying the surface of the interconnect structure comprises one of stripping with a stripping agent, planarizing, polishing, and doping with a dopant;
   forming the third conductive material on an exposed portion of the interconnect structure,
   wherein the first conductive material comprises a unidirectional electrical conductivity and the unidirectional conductivity is configured to be in a direction corresponding to a projection to or from the contact point and the second conductive material, and wherein the third conductive material comprises a unidirectional electrical conductivity in a direction normal to the exposed portion of the interconnect structure.

3. A method comprising:
   forming a first conductive material in an opening through a dielectric to a contact point; and
   forming a second conductive material on the first conductive material,
   wherein the first conductive material comprises a unidirectional electrical conductivity and the unidirectional conductivity is configured to be in a direction corresponding to a projection to or from the contact point and the second conductive material, and wherein forming the first conductive material comprises deposition via one of electroplating, chemical vapor deposition, sputter deposition, molecular beam deposition, and gel separation in an electronic field.

4. A method comprising:
   forming a first conductive material in an opening through a dielectric to a contact point; and
   forming a second conductive material on the first conductive material,
   wherein the first conductive material comprises a unidirectional electrical conductivity and the unidirectional conductivity is configured to be in a direction corresponding to a projection to or from the contact point and the second conductive material, and wherein forming the first conductive material includes forming a layer of material comprising a property tending to reduce metal diffusion between the second conductive material and the dielectric.

5. A method comprising:
   forming a first conductive material in an opening through a dielectric to a contact point; and
   forming a second conductive material on the first conductive material,
   wherein the first conductive material comprises a unidirectional electrical conductivity and the unidirectional conductivity is configured to be in a direction corresponding to a projection to or from the contact point and the second conductive material, and wherein forming the first conductive material includes forming a layer of material comprising a property tending to reduce electron migration between the second conductive material and the dielectric.

6. A method comprising:

forming a first conductive material in an opening through a dielectric to a contact point; and forming a second conductive material on the first conductive material, wherein the first conductive material comprises a unidirectional electrical conductivity and the unidirectional conductivity is configured to be in a direction corresponding to a projection to or from the contact point and the second conductive material, and wherein forming the first conductive material includes forming a layer of material comprising a property tending to act as an etch stop layer.

7. A method comprising:

forming a first conductive material in an opening through a dielectric to a contact point;

chemically-mechanically polishing the first conductive material with a polishing slurry;

forming a second conductive material on the first conductive material, wherein the first conductive material comprises a unidirectional electrical conductivity and the unidirectional conductivity is configured to be in a direction corresponding to a projection to or from the contact point and the second conductive material.

8. A method comprising:

forming a first conductive material in an opening through a dielectric to a contact point;

doping the first conductive material;

forming a second conductive material on the first conductive material, wherein the first conductive material comprises a unidirectional electrical conductivity and the unidirectional conductivity is configured to be in a direction corresponding to a projection to or from the contact point and the second conductive material.

* * * * *